(12) United States Patent
Teggatz et al.

(10) Patent No.: US 9,906,018 B2
(45) Date of Patent: Feb. 27, 2018

(54) ELECTRICAL LINE STATUS MONITORING SYSTEM

(75) Inventors: Ross E. Teggatz, McKinney, TX (US); Wayne T. Chen, Plano, TX (US); Brett Smith, McKinney, TX (US); James Kohout, Dallas, TX (US)

(73) Assignee: TRIUNE SYSTEMS, LLC, Plano, TX (US)

( * ) Notice: Subject to any disclaimer, the term of this patent is extended or adjusted under 35 U.S.C. 154(b) by 1416 days.

(21) Appl. No.: 13/355,396

(22) Filed: Jan. 20, 2012

(65) Prior Publication Data

US 2012/0188673 A1   Jul. 26, 2012

Related U.S. Application Data

(60) Provisional application No. 61/434,696, filed on Jan. 20, 2011.

(51) Int. Cl.
| | |
|---|---|
| *H02H 3/00* | (2006.01) |
| *H02H 11/00* | (2006.01) |
| *G01R 19/165* | (2006.01) |
| *G01R 31/28* | (2006.01) |
| *H02H 3/08* | (2006.01) |
| *H02H 3/18* | (2006.01) |
| *H02H 3/04* | (2006.01) |
| *H02H 3/40* | (2006.01) |
| *H02H 3/42* | (2006.01) |
| *H02H 7/26* | (2006.01) |

(52) U.S. Cl.
CPC ..... *H02H 11/005* (2013.01); *G01R 19/16552* (2013.01); *G01R 31/2853* (2013.01); *H02H 3/08* (2013.01); *H02H 3/18* (2013.01); *H02H 11/006* (2013.01); *H02H 3/04* (2013.01); *H02H 3/40* (2013.01); *H02H 3/42* (2013.01); *H02H 7/267* (2013.01)

(58) Field of Classification Search
CPC .......... H02H 3/08; H02H 3/10; H02H 11/005; H02H 11/006; H02H 3/04; H02H 3/18; H02H 3/40; H02H 3/42; H02H 7/267; G01R 19/16552; G01R 31/2853
USPC .................................................. 361/93.1, 79
See application file for complete search history.

(56) References Cited

U.S. PATENT DOCUMENTS

| | | | | |
|---|---|---|---|---|
| 5,648,887 A | * | 7/1997 | Herndon | B66D 1/40 361/31 |
| 6,657,837 B1 | * | 12/2003 | Morris | H02H 11/008 361/72 |
| 8,461,847 B2 | * | 6/2013 | Teggatz | G01R 31/025 324/527 |

(Continued)

FOREIGN PATENT DOCUMENTS

JP   2006280057 A   * 10/2006

*Primary Examiner* — Ronald W Leja
(74) *Attorney, Agent, or Firm* — Jackson Walker LLP; Christopher J. Rourk; Thomas B. Hayes

(57) ABSTRACT

Disclosed are advances in the arts with novel methods and apparatus for detecting faulty connections in an electrical system. Exemplary preferred embodiments include monitoring techniques and systems for monitoring signals at one or more device loads and analyzing the monitored signals for determining fault conditions at the device loads and/or at the main transmission lines. The invention preferably provides the capability to test and monitor electrical interconnections without fully activating the host system.

20 Claims, 3 Drawing Sheets

(56) References Cited

U.S. PATENT DOCUMENTS

| | | | | |
|---|---|---|---|---|
| 8,896,318 | B2* | 11/2014 | Teggatz | G01R 31/025 324/527 |
| 9,354,268 | B2* | 5/2016 | Teggatz | G01R 31/025 |
| 9,599,660 | B2* | 3/2017 | Teggatz | G01R 31/025 |
| 2001/0040458 | A1* | 11/2001 | MacBeth | H02H 1/0015 324/536 |
| 2005/0073273 | A1* | 4/2005 | Maslov | H02P 6/12 318/437 |
| 2005/0171647 | A1* | 8/2005 | Kunsman | H02H 1/0092 700/293 |
| 2006/0125470 | A1* | 6/2006 | Chen | G01R 31/3008 324/750.3 |
| 2006/0200688 | A1* | 9/2006 | Tofigh | H02H 1/0015 713/300 |
| 2009/0013210 | A1* | 1/2009 | McIntosh | H04L 12/2697 714/4.1 |
| 2010/0213949 | A1* | 8/2010 | Teggatz | G01R 31/025 324/528 |
| 2012/0188673 | A1* | 7/2012 | Teggatz | G01R 19/16552 361/64 |

* cited by examiner

ELECTRICAL LINE STATUS MONITORING SYSTEM

PRIORITY ENTITLEMENT

This application is entitled to priority based on Provisional Patent Application Ser. No. 61/434,696 filed on Jan. 20, 2011, which is incorporated herein for all purposes by this reference. This application and the Provisional Patent Application have at least one common inventor.

TECHNICAL FIELD

The invention relates to monitoring the status of device connections in electrical systems for addressing concerns related to system reliability, quality, and safety. More particularly, the invention relates to monitoring the status of systems that include multi-wire interconnects and/or long transmission lines. In preferred embodiments, the invention relates to the more efficient utilization of energy resources.

BACKGROUND OF THE INVENTION

For various power systems, the power source may be limited in the amount of current that can be supplied to the system. As such, if a short or soft-short occurs, the loading on the power supply line increases, which will then reduce the voltage on the line and disabling all the circuitry that is to be powered on the line.

In systems requiring that multiple loads be electrically coupled to one or more main lines, many connection approaches known in the arts may be used. The load lines may be connected off a main line in a linear transmission line configuration, star configuration, or daisy chain configuration, for example. An example familiar in the arts is a system configuration in which load lines are connected off the main line in a two-wire system with a transmission line configuration. A matrix configuration is also known in the arts, in which loads are connected to main lines using a web of load lines arranged in rows and columns. Those familiar with the arts will recognize that various combinations of such configurations may also be used, such as a linear transmission line connected with one or more star configuration, for example. The complexity of the connections may in some instances be very high and the connections may extend over a very large physical area.

Regardless which arrangement of system connections are used, the status of device connections in electrical systems can be outside acceptable limits due to poor installation, environment conditions, external conditions, and/or operational errors. If faulty connections are not detected, the individual device or entire system performance can be affected resulting in potential quality, reliability, and/or safety problems. Due to various challenges, monitoring the status of the interconnect system can be difficult at times. For example, when the connection lines are extremely long, on the order of kilometers, it becomes a challenge to find the locations of faulty connections or loads. Other challenges are environmental conditions that could directly contribute to the increased likelihood of faulty loads due to sharp objects, corrosive materials, extreme temperatures, wind, ice, etc. It would therefore be useful to have the capability to conveniently and reliably monitor the status of an interconnect system. One example that demonstrates a need for monitoring a complex interconnect system is in the mining industry, where electronic apparatus is used to control a substantially precisely timed string of detonations. Such a system often uses a multi-wire line interconnect where all the device loads are tapped into the same signals at different points of the interconnect system. Marginal interconnect status of the tap wires and connections can affect performance of one or more devices. Conventional integrity check methods often fail to detect such marginal conditions. Due to these and other problems and potential problems, improved status monitoring of an interconnect system would be useful and advantageous in the arts. Reliable yet easy to use detection systems and methods would be particularly beneficial contributions to the art.

SUMMARY OF THE INVENTION

In carrying out the principles of the present invention, in accordance with preferred embodiments, the invention provides advances in the arts with novel methods and apparatus directed to detecting faulty connections in an electrical system. According to aspects of the invention, preferred embodiments include a transmission line monitoring system. Examples of various preferred embodiments of such monitoring systems are described.

According to one aspect of the invention, an example of a preferred embodiment of a method for monitoring the status of an electrical line includes a step for monitoring current between a source and a load. Detection of a current level above a first threshold indicates the existence and location of a fault and results in the disconnection of the load from the power source. In a further step, absent a current level above the first threshold, power is provided to the load and current is monitored. In the event a current level above a second threshold is detected, the load is disconnected and the existence and location of a fault is indicated.

According to another aspect of the invention, a preferred embodiment of the electrical line status monitoring method includes steps as summarized above, modified to perform the same functions by monitoring voltage instead of current.

According to an aspect of the invention, in an exemplary embodiment the electrical line status monitoring method further includes steps for monitoring one or more local parameters at the location of a load.

According to one aspect of the invention, an example of a preferred embodiment of a system for monitoring the status of an electrical line includes circuitry configured to monitor current or voltage levels between a power source and a load. Switches are provided for causing the load to be disconnected from the source upon detection of a level above a first threshold, indicating the existence and location of a fault. In the absence of a current or voltage level above the selected threshold, the switches enable power to be provided to the load. The circuit is equipped to continue to monitor current or voltage between the source and load, and upon detection of a voltage level above a second threshold, to activate a switch to disconnect the load from the power supply, indicating the existence and location of a fault.

According to another aspect of the invention, in an exemplary embodiment the electrical line status monitoring system further includes one or more sensors for monitoring one or more local parameters at the location of a load.

According to another aspect of the invention, in an exemplary embodiment the electrical line status monitoring system is preferably implemented as an application-specific integrated circuit (ASIC).

The invention has advantages including but not limited to providing one or more of the following features; improved efficiency, accuracy and safety in monitoring the status of device connections in electrical systems, including the ability to test and monitor connections without fully activating the host system. These and other advantageous features and benefits of the present invention can be understood by one of ordinary skill in the arts upon careful consideration of the detailed description of representative embodiments of the invention in connection with the accompanying drawings.

BRIEF DESCRIPTION OF THE DRAWINGS

The present invention will be more clearly understood from consideration of the following detailed description and drawings in which.

References in the detailed description correspond to like references in the various drawings unless otherwise noted. Descriptive and directional terms used in the written description such as front, back, top, bottom, upper, side, et cetera; refer to the drawings themselves as laid out on the paper and not to physical limitations of the invention unless specifically noted. The drawings are not to scale, and some features of embodiments shown and discussed are simplified or amplified for illustrating principles and features, as well as advantages of the invention.

DESCRIPTION OF PREFERRED EMBODIMENTS

The present patent application is related to U.S. patent application Ser. No. 12/710,307 which shares at least one common inventor with the present application and has a common assignee. Said related application is hereby incorporated herein for all purposes by this reference.

While the making and using of various exemplary embodiments of the invention are discussed herein, it should be appreciated that the present invention provides inventive concepts which can be embodied in a wide variety of specific contexts. It should be understood that the invention may be practiced with various electronic circuits, systems, system components, host systems, and subsystems without altering the principles of the invention. For purposes of clarity, detailed descriptions of functions, components, and systems familiar to those skilled in the applicable arts are not included. In general, the invention provides electrical connection status monitoring of connections within an associated host electrical system, providing capabilities for identifying and locating faulty connections. Preferably, the connection status monitoring may be performed with the system in a test mode, facilitating the making of repairs prior to full activation of the host system.

Figure 1:
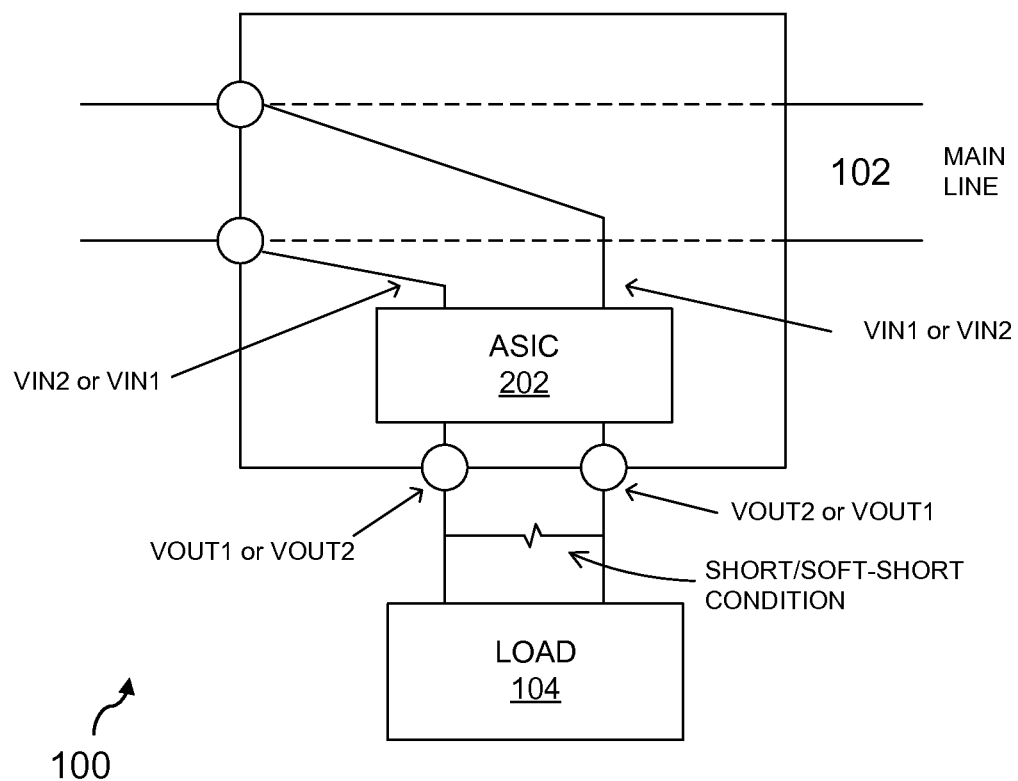
FIG. 1 is a simplified schematic diagram illustrating an example of a preferred embodiment of an electrical interconnect status monitoring system and method using an ASIC placed between the load and the main line for the purpose of monitoring the status of the line.

Referring primarily to FIG. 1, an electrical line status monitoring system 100 is shown. This system 100 provides a connection between the power line 102 of associated electronics and an electrical load 104. In this particular application, the electronic load 104 may preferably be held in reset during initial power sequencing. For other applications, an alternative current limit or voltage detection may be used to detect a short or soft short as further described herein. For this exemplary system 100, the sequence of operation is preferably as follows. Upon power up, a short detection application-specific integrated circuit (ASIC) 202 monitors the supply current going to the electronic load 104 via the main line 102. This electronic load 104 remains in a low power state. The short detection ASIC 202 then measures the current supplied to the electronic load 104. Placed between the main lines 102 and device loads 104, the purpose of the ASIC 202 is to detect, analyze and report fault conditions associated with the loads 104 or main line 102. In the case of a short at a load, e.g., 104, higher currents and/or voltages are drawn from the main line 102. The ASIC 202 then latches off and isolates the faulty load 104 from the main line 102. The ASIC 202 also preferably includes a communication functionality that is used to report when a fault is identified and isolated. In this example, if the current detected at the load 104 is larger than a selected threshold level, e.g., 2 mA, then a soft-short is suspected, assuming 28V across the main line wires 102 and a 10 kOhm short. The values herein are given by way of example representative of an implementation of the practice of the invention. The threshold value of the soft short current can be tailored to each system, and be higher or lower than this example.

Figure 2:
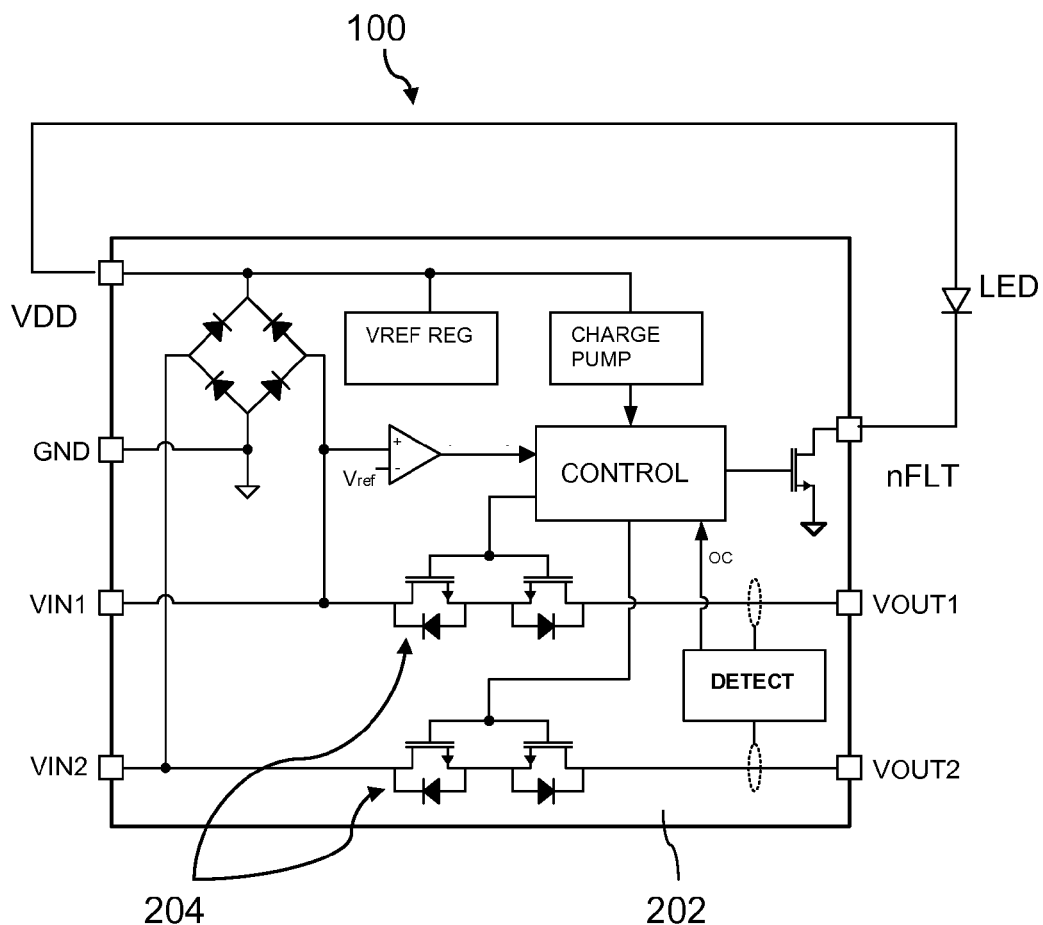
FIG. 2 is a simplified schematic diagram depicting an example of a preferred embodiment of an electrical interconnect status monitoring system and method.

Now also referring to FIG. 2, preferably switches 204 are provided in the short detection ASIC 202. Upon detection of a short condition, the switches 204 are caused to open, disconnecting the electronic load 104 from the power VIN1, VIN2 (102 in FIG. 1). In this scenario, when the system is activated upon powering up a host system, the faulty electronic load 104 is prevented from being able to power up, and hence no communication would be possible to this electronic load 104, giving indication which load, potentially among numerous loads in a larger system, has a short or soft-short. In the event no soft-short is detected, then the short detection ASIC's 202 switches 204 remain "on", and permit the electronic load 104 to be powered in a fully operational state. Preferably, after the lapse of a selected interval of time, the short detection ASIC 202 then switches over to a higher current detection state, for example, greater than 50 mA, although any level may be chosen that is higher than the selected soft-short detection threshold. In this higher current detection state, the short detection ASIC 202 monitors the current supplied to the electronic load 104. If a current condition higher than the selected threshold is detected, then the switches 204 in the soft-short detection ASIC 202 are opened, and communication and power to the electronic load 104 is interrupted. A query of each electronic load in a larger system then indicates which load location, if any, e.g., 104, has not communicated, which pinpoints the location of the failure.

Instead of or in addition to monitoring current, the short detection ASIC 202 may also be adapted to monitor voltage in a similar manner in order to detect shorts by measuring the voltage difference on the VOUT1 and VOUT2 outputs. In the event the voltage difference is below a selected threshold, this indicates a fault condition and the ASIC 202 switches 204 open in the manner described above. Similarly, a comparison may also be made between the voltages on the input VIN nodes and the VOUT nodes. These voltages may be compared single-ended (as an example, VIN1 compared with VOUT1), or differentially to determine whether the difference is significant in comparison to a selected threshold, indicating the existence of a fault. The short detection ASIC 202 may also monitor power to detect the short by measuring voltage or current supplied to the load 104. In the event the power level is too high in comparison with an acceptable threshold, then this indicates a fault condition and the switches 204 open.

Once a fault is detected, the ASIC 202 may also indicate the fault condition by providing an electronic alert such as an audio tone and/or visual display. This is illustrated in FIG. 2 by showing an LED representative of a visual display, although various alternative visual, audio, haptic, or other alerts or displays may instead or also be used without departure from the invention.

Figure 3:
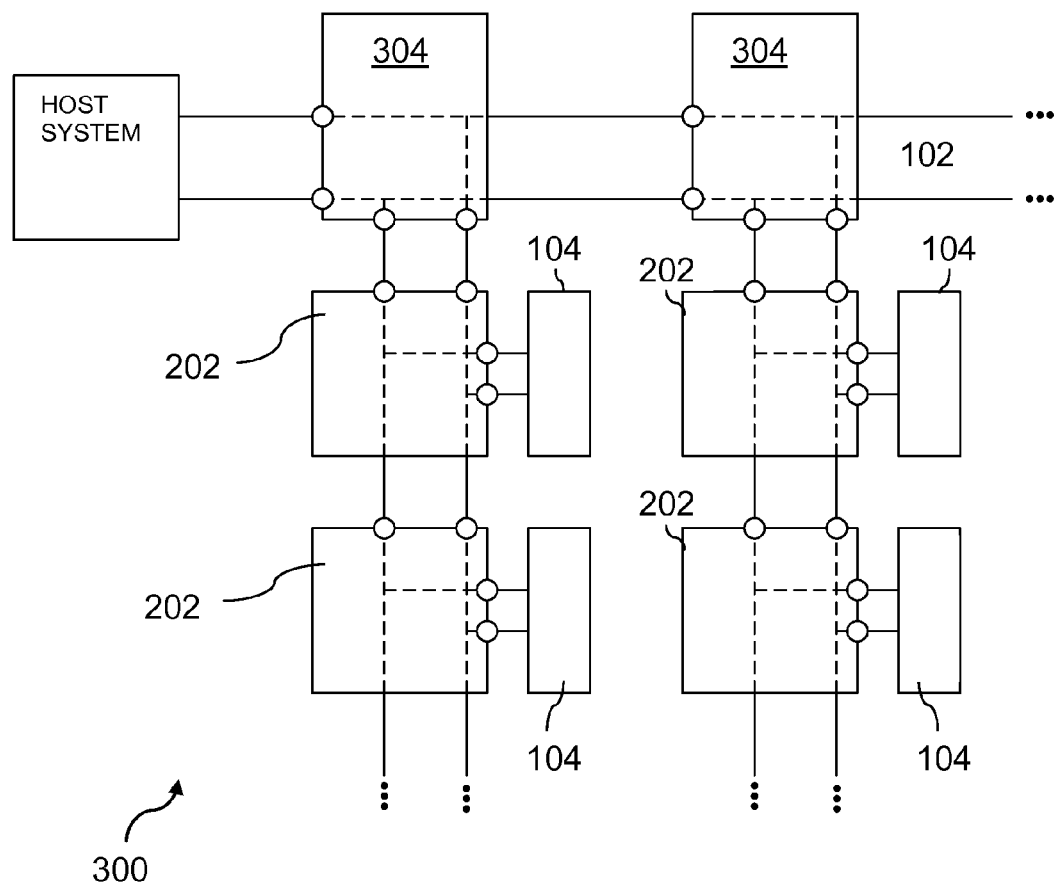
FIG. 3 is a simplified schematic diagram showing an example of a preferred embodiment of an electrical interconnect status monitoring system and method deployed in association with a system array of monitored loads.

The electrical interconnect status monitoring system 100 may be deployed for a single electronic load, e.g., load 104 in FIG. 1, or for a group of electronic loads, or in combinations with various network configurations such as a branched network system 300 as shown in the example of FIG. 3. The electrical interconnect status monitoring system 302 may include individual ASICs 202 for numerous loads as well as ASICs 304 situated for serving as junction connectors when more than one electronic loads are connected in a larger system 300. The fault detection threshold for these junction connectors 304 may be the same as other short detection ASICs 202 deployed in the system 300 or may be identical or unique, and may be configurable either in the field and/or during system manufacturing.

A host system may be monitored using the ASIC 202 to perform impedance measurements at the outputs of the system (e.g., 300) over various voltages. It should be noted that soft-short conditions may not be linear and may change significantly with voltage. In alternative embodiments of electrical interconnect status monitoring systems, either comparators may be used to measure selected voltage levels or a signal conditioning interface with a look-up table may be used to store data and flag potential system problems. This information may then be transmitted to an operator, and/or to additional control apparatus deployed with the electrical interconnect status monitoring system, using suitable wired or wireless communication circuitry. A digital and/or analog protocol may be provided to the ASIC 202 and be adapted for dynamically adjusting a variety of parameters which may include, but are not necessarily limited to current limit level, impedance evaluation over voltage potential, communication validation of a host system, and other various safety and hardware functions. The ASIC 202 may be configured to detect temperature, humidity levels, alkalinity/acidity, or other local conditions in the operating environment. Monitored data relating to these conditions can then be sent back to an operator, control equipment, or other recipient.

The ASIC 202 and electrical line status monitoring system 100 and methods can be used in association with a host system in a variety of ways. Star configurations, multi-star configurations, multiple series configurations, ring configurations, grid configurations, parallel configurations, and figurations having an electrical interconnect status monitoring system as a central control unit may be employed, as well as other network configuration schemes. Deploying multiple ASIC 202 and electrical line status monitoring systems 100 and suitable control units in combination with series, parallel, star, ring, grid, or other network schemes is also possible within the scope of the invention.

The threshold levels for monitored parameters may be preselected and/or reprogrammed in the ASIC 202 and electrical line status monitoring system 100 depending upon application specific requirements. Time intervals may also be adjusted either longer or short for soft-short/short circuit detection times. This attribute can preferably be programmed either in the field or at the factory through on-chip memory, external components, pin configurations, and other circuit configuration techniques. Time duration can also be used in conjunction with other events, such as the detection of communication pulse down the line, voltage or current levels, temperature, or other types of events.

The methods and apparatus of the invention provide one or more advantages including but not limited to, electrical interconnect status monitoring efficiency, safety, convenience, and reduced cost. While the invention has been described with reference to certain illustrative embodiments, those described herein are not intended to be construed in a limiting sense. For example, variations or combinations of steps or materials in the embodiments shown and described may be used in particular cases without departure from the invention. Various modifications and combinations of the illustrative embodiments as well as other advantages and embodiments of the invention will be apparent to persons skilled in the arts upon reference to the drawings, description, and claims.

We claim:

1. An electrical line status monitoring method comprising the steps of:
    monitoring current between a source and a load operably coupled to a line;
    upon detection of a current level above a first threshold, prior to powering up the load, causing the load to be disconnected from the source, thereby indicating the existence and location of a line fault; and
    absent a current level above the first threshold, providing power to the load; and subsequently,
    monitoring current between the source and load operably coupled to the line;
    upon detection of a current level above a second threshold, causing the load to be disconnected from the source, thereby indicating the existence and location of a line fault; and
    absent a current level above the second threshold, continuing to provide power to the load.

2. An electrical line status monitoring method according to claim 1 wherein the step of causing the load to be disconnected from the source upon detection of a current level above a first threshold coincides with system startup.

3. An electrical line status monitoring method according to claim 1 wherein the step of causing the load to be disconnected from the source upon detection of a current level above a second threshold coincides with a current level less than an anticipated peak current of the system.

4. An electrical line status monitoring method according to claim 1 comprising the further step of monitoring one or more local parameters at the location of a load.

5. An electrical line status monitoring method according to claim 1 comprising the further step of monitoring, at the location of a load, one or more local parameters selected from the group: temperature; humidity; alkalinity; acidity; impedance; conductivity; viscosity; and density.

6. The method of claim 1 further comprising generating a visual display to indicate a fault.

7. The method of claim 1 further comprising generating an audio indication of a fault.

8. The method of claim 1 wherein causing the load to be disconnected from the source comprises latching the load to isolate the load from the source.

9. An electrical line status monitoring system comprising:
    a circuit adapted for monitoring current between a source and a load operably coupled to a power line;
    wherein the circuit comprises one or more switches for causing the load to be disconnected from the source upon detection of a current level above a first threshold, prior to powering up the load, and absent a current level above the first threshold, for providing power to the load; and wherein the circuit is adapted to indicate the existence and location of a line fault upon detection of a current level above the first threshold.

10. An electrical line status monitoring system according to claim 9, wherein the circuit is adapted to detect a current level above a second threshold, and wherein the circuit comprises one or more switches for causing the load to be disconnected from the source upon detection of a current level above the second threshold, and absent a current level above the second threshold, for continuing providing power to the load; and wherein the circuit is adapted to indicate the existence and location of a fault upon detection of a current level above the second threshold.

11. An electrical line status monitoring system according to claim 9 further comprising a sensor for sensing local parameters.

12. An electrical line status monitoring system according to claim 9 further comprising a sensor for sensing one or more local parameters selected from among the group: temperature; humidity; alkalinity; acidity; impedance; conductivity; viscosity; and density.

13. An electrical line status monitoring system according to claim 9 wherein the circuit comprises an application-specific integrated circuit.

14. The system of claim 9 further comprising a circuit configured to generate a visual display to indicate a fault.

15. The system of claim 9 further comprising a circuit configured to generate an audio indication of a fault.

16. The system of claim 9 further comprising a plurality of the circuits adapted for monitoring the current between the source and each of a corresponding plurality of different loads that are operably coupled to the power line, wherein each of the plurality of circuits comprises an indicator to generate a visual or audio indicator of a fault associated with that circuit.

17. The system of claim 9 further comprising a plurality of the circuits adapted for monitoring the current between the source and each of a corresponding plurality of different loads that are operably coupled to the power line, and a junction connector coupled to two or more of the plurality of circuits, wherein the junction connector comprises fault detection and indication circuitry.

18. The system of claim 9 further comprising a system coupled to the circuitry and configured to perform impedance measurements at a plurality of outputs.

19. The system of claim 9 further comprising a signal conditioning interface having a look-up table to store fault indication data.

20. The system of claim 9 further comprising a data transmission system configured to transmit fault data to an operator.

* * * * *